United States Patent
Yamamoto et al.

[11] Patent Number: 6,147,843
[45] Date of Patent: *Nov. 14, 2000

[54] MAGNETORESISTIVE EFFECT ELEMENT HAVING MAGNETORESISTIVE LAYER AND UNDERLYING METAL LAYER

[75] Inventors: Hidefumi Yamamoto; Kazuhiko Hayashi; Masafumi Nakada; Jun-Ichi Fujikata; Kunihiko Ishihara, all of Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/788,507

[22] Filed: Jan. 24, 1997

[30] Foreign Application Priority Data

Jan. 26, 1996 [JP] Japan ..................... 8-011572

[51] Int. Cl.[7] ..................... G11B 5/39
[52] U.S. Cl. ..................... 360/313
[58] Field of Search ..................... 360/113, 313, 360/325, 327; 324/252; 338/32 R

[56] References Cited

U.S. PATENT DOCUMENTS

| | | | |
|---|---|---|---|
| 4,988,641 | 1/1991 | Solomon | 437/83 |
| 5,341,118 | 8/1994 | Parkin et al. | 338/32 R |
| 5,432,661 | 7/1995 | Shinjo et al. | 360/113 |
| 5,452,163 | 9/1995 | Coffey et al. | 360/113 |
| 5,461,527 | 10/1995 | Akiyama et al. | 360/113 |
| 5,552,949 | 9/1996 | Hashimoto et al. | 360/113 |
| 5,583,727 | 12/1996 | Parkin | 360/113 |
| 5,585,986 | 12/1996 | Parkin | 360/113 |
| 5,598,308 | 1/1997 | Dieny et al. | 360/113 |
| 5,796,560 | 8/1998 | Saito et al. | 360/113 |
| 5,849,422 | 12/1998 | Hayashi | 428/611 |
| 5,850,323 | 12/1998 | Kanai | 360/113 |

FOREIGN PATENT DOCUMENTS

| | | |
|---|---|---|
| 2-61572 | 3/1990 | Japan . |
| 4-358310 | 12/1992 | Japan . |
| 5-82342 | 4/1993 | Japan . |
| 6-111252 | 4/1994 | Japan . |
| 06295818 | 10/1994 | Japan . |
| 06325934 | 11/1994 | Japan . |
| 7-142783 | 6/1995 | Japan . |
| 07202292 | 8/1995 | Japan . |
| 07220246 | 8/1995 | Japan . |
| 07230610 | 8/1995 | Japan . |
| 8-315326 | 11/1996 | Japan . |

OTHER PUBLICATIONS

Inoue et al., "Iwanami Physics and Chemistry Dictionary", p. 55, 343–344, 1050, 1958.

David A. Thompson et al., "Thin Film Magnetoresistors in Memory, Storage and Related Applications", IEEE Trans. on Magnetics, vol. MAG–11, No. 4, pp. 1039–1050, Jul. 1975.

Primary Examiner—William Klimowicz

[57] ABSTRACT

In a magnetoresistive element, an underlying metal layer is formed on a substrate, and a magnetoresistive layer is formed on the underlying metal layer. The underlying metal layer has a thickness of about 0.1 to 3.0 nm.

13 Claims, 9 Drawing Sheets

Fig. 4

| MATERIAL OF LAYER 2 | THICKNESS (nm) OF LAYER 2 HAVING FWHM OF ROCKING CURVE OF LESS THAN 5° |
|---|---|
| Pt | 0.1 ~ 8.0 |
| Be | 0.1 ~ 3.0 |
| Cy | 0.1 ~ 13.0 |
| Fe | 0.1 ~ 5.0 |
| W | 0.1 ~ 20.0 |
| Y | 0.1 ~ 5.0 |

Fig. 5

| | MELT-DOWN CURRENT DENSITY (A/cm$^2$) |
|---|---|
| PRIOR ART | 1 × 10$^6$ |
| EMBODIMENT | 7 × 10$^6$ |

MAGNETORESISTIVE EFFECT ELEMENT HAVING MAGNETORESISTIVE LAYER AND UNDERLYING METAL LAYER

BACKGROUND OF THE INVENTION

1. Field of the Invention

The present invention relates to a magnetoresistive effect element used as a magnetic sensor.

2. Description of the Related Art

As reproducing heads for reading information from a magnetic medium, a magnetoresistive (MR) sensor or head using a magnetoresistive effect is known. The MR sensor operates in accordance with an anisotropic magnetoresistive effect: the resistance of a magnetoresistive layer is dependent upon the square of the cosine of an angle between a magnetization direction and a sense current direction of a ferromagnetic layer (see: David A. Thompson et al., "Thin Film Magnetoresistors in Memory, Storage, and Related Applications", IEEE Trans, on Magnetics, Vol. Mag-11, No. 4, PP. 1039–1050, July 1975).

On the other hand, laminated MR sensors, i.e., artificial lattice structured MR sensors, have recently been suggested to enhance the anisotropic magnetoresistive effect, which is called a giant magnetoresistive effect or a spin valve effect. That is, a magnetoresistive multi-layer is formed by a pair of ferromagnetic layers separated by a nonmagnetic layer. In this case, a resistance of the MR multi-layer is dependent upon an angle between magnetization directions of the adjacent ferromagnetic layers, to obtain a large resistance change.

In a first prior art laminated MR sensor (see: JP-A-2-61572), the ferromagnetic layers are made of appropriate materials such as ferromagnetic transition metal or its alloy, so that one of the ferromagnetic layers has an opposite magnetization direction to that of the other ferromagnetic layers in accordance with the application or nonapplication of an external magnetic field. Also, the thickness of the nonmagnetic layer is smaller than the conductive electron mean path. Thus, a larger magnetoresitive effect can be obtained.

In a second prior art laminated MR sensor (see JP-A-4-358310), when a magnetic field is not applied thereto, a magnetization direction of one of the ferromagnetic layers is perpendicular to a magnetization direction of the other, so that a resistance between the ferromagnetic layers is dependent upon the cosine of an angle between the magnetization directions of the ferromagnetic layers independent of a sense current flowing therethrough.

Generally, an output $V_s$ of an MR sensor (magnetoresistive element) is represented by $$V_s = I_s \cdot R$$

where $I_s$ is a definite sense current; and
R is a resistance of the magnetoresistive element. Therefore, the difference $\Delta V_s$ is $$\Delta V_s = I_s \times \Delta R$$

where $\Delta R$ is a change of the resistance of the magnetoresistive element. Thus, in order to increase the sensitivity of the magnetoresistive element, one approach is to increase the change of the resistance, and the other approach is to increase the definite sense current $I_s$.

Without changing the materials of the magnetoresistive element, it is known for the change of the resistance to be increased by improving the crystalline characteristics and crystalline orientation characteristics of the magnetoresistive element. However, since the thickness of the entire magnetoresistive element is very thin, for example, about 10 to 30 nm, it is substantially impossible to improve the crystalline characteristics and the crystalline orientation characteristics.

Also, in the multi-layer structured MR sensors, a heat process during a photolithography process creates diffusion between the ferromagnetic layers and the nonmagnetic layers, which reduces the property of the magnetoresistive element. For example, if each of the ferromagnetic layers is made of a NiFe layer, and each of the nonmagnetic layers is made of a Cu layer, Cu atoms penetrate into grain boundaries of the NiFe layer, and Ni atoms and Fe atoms penerate into grain boundaries of the Cu layer.

On the other hand, in a high density magnetic recording medium, the pitch of tracks is very small, so that the pitch of heads of the MR sensors therefor is also very small. That is, the magnetoresistive element is small in size. In this case, in order to maintain the sensitivity of the magnetoresistive element, a current density of the sense current $I_s$ has to be increased, i.e., to about $5 \times 10^5$ to $1 \times 10^8$ Å/cm$^2$. As a result, electromigration due to high electric field occurs in the magnetoresistive element which destroys the magnetoresistive element.

SUMMARY OF THE INVENTION

It is an object of the present invention to provide a magnetoresistive element having a large resistance change, good heat-resistance characteristics and anti-electromigration characteristics.

According to the present invention, in a magnetoresistive element, an underlying metal layer is formed on a substrate, and a magnetoresistive layer is formed on the underlying metal layer. The underlying metal layer has a thickness of about 0.1 to 3.0 nm.

BRIEF DESCRIPTION OF THE DRAWINGS

The present invention will be more clearly understood from the description as set forth below, with reference to the accompanying drawings, wherein:

FIG. 4 is a table showing the thickness of the underlying metal layer of FIG. 1;

FIG. 5 is a table showing the melt-down current density characteristics of the magnetoresistive layer of FIG. 1;

DESCRIPTION OF THE PREFERRED EMBODIMENT

Figure 1:
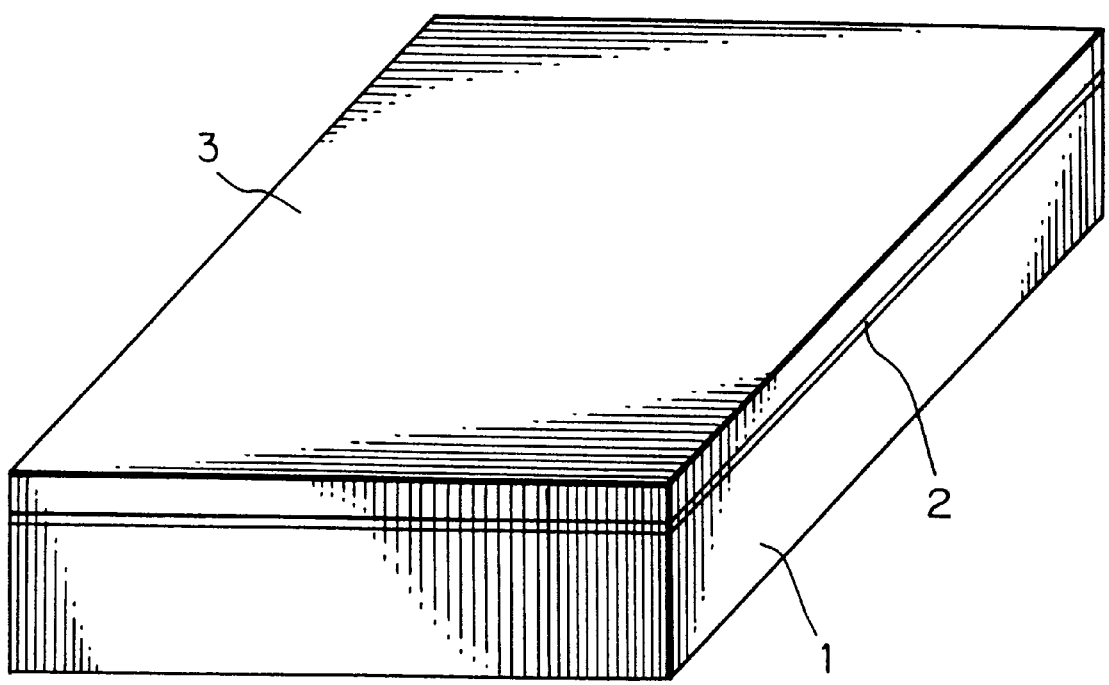
FIG. 1 is a cross-sectional view illustrating an embodiment of the magnetoresistive element according to the present invention.

In FIG. 1, which illustrates an embodiment of the magnetoresistive element according to the present invention, reference numeral 1 designates a glass substrate on which an about 0.1 to 3.0 nm thick underlying metal layer 2 made of Al, Pt, Be, Cr, Fe, W or Y is formed. Further, an about 30 nm thick magnetoresistive layer 3 made of NiFe is formed on the underlying metal layer 2. In this case, the underlying metal layer 2 and the magnetoresistive layer 3 are continuously grown in an ion beam sputtering apparatus under the following conditions:

ultimate vacuum: less than $1 \times 10^{-5}$ Pa;

sputterring gas pressure: about $1 \times 10^{-2}$ Pa;

sputterring gas: Ar;

ion source beam voltage: about 1000V;

ion source beam current: about 50 to 60 mA; and layer growth: about 3 to 7 nm/min.

Note that the NiFe magnetoresitive layer 3 has a face-centered cubic lattice configuration.

Figure 2:
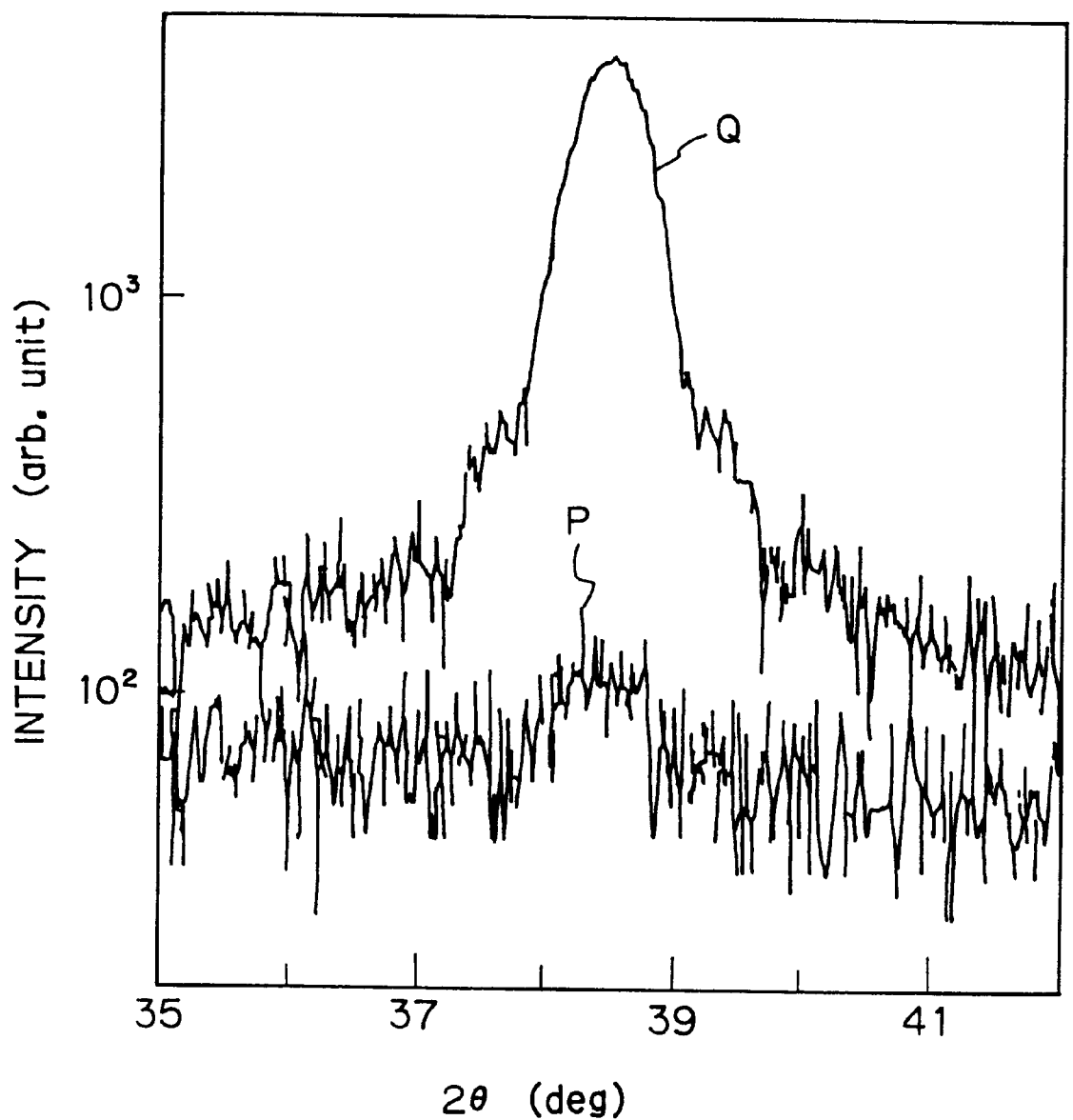
FIG. 2 is a graph showing the X-ray diffraction intensity characteristics of the magnetoresitive layer of FIG. 1.

In FIG. 2, which shows X-ray diffraction intensity characteristics of a NiFe magnetoresitive layer, a curve P designates a prior art case where the magnetoresistive layer 3 of FIG. 1 is formed directly on the glass substrate 1 of FIG. 1. In this case, since the glass substrate 1 is amorphous, the NiFe magnetoresistive layer 3 grown on the glass substrate 1 becomes polycrystalline, so that the (111) orientation characteristics of the NiFe magnetoresistive layer 3 deteriorate. That is, as shown in FIG. 2, a peak of about 300 counts having a rocking half-amplitude of about 13° was observed.

On the other hand, in FIG. 2, a curve Q designates a case of the embodiment of FIG. 1 where the magnetoresistive layer 3 is formed via the underlying metal layer 2 on the glass substrate 1. For example, the underlying metal layer 2 is made of 0.1 nm thick Al. The (111) orientation characteristics of the NiFe magnetoresistive layer 3 are improved. That is, as shown in FIG. 2, a peak of about 4000 counts having an FWHM of the rocking curve of about 3° was observed.

Figure 3:
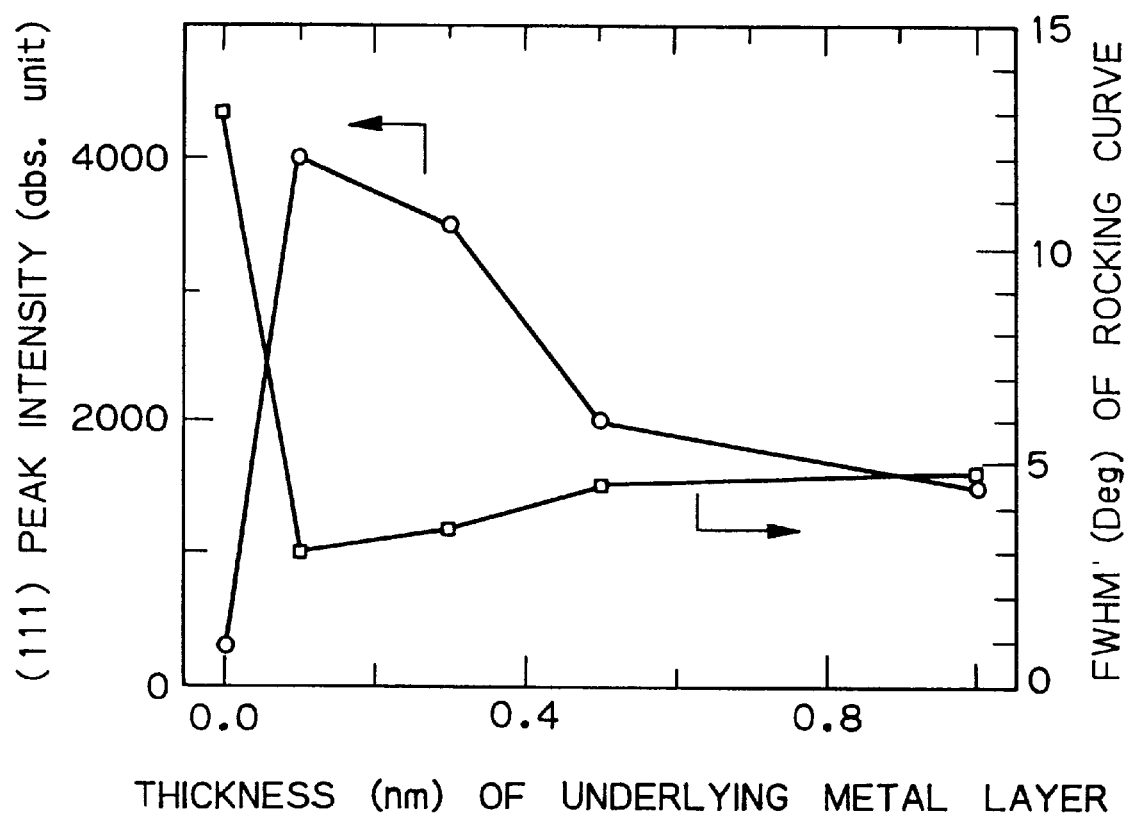
FIG. 3 is a graph showing the (111) peak intensity characteristics and the full width at half of the maximum intensity (FWHM) of the rocking curve characteristics of the magnetoresitive layer in dependency of the thickness of the underlying metal layer of FIG. 1.

FIG. 3 shows the (111) peak intensity characteristics and the rocking curve characteristics of the magnetoresistive layer 3 in dependency of the thickness of the underlying metal layer 2 of the FIG. 1. In FIG. 3, the underlying metal layer 2 is made of Al. As shown in FIG. 3, when the thickness of the underlying metal layer 2 is approximately from 0.1 to 3.0 nm, the (111) peak intensity is large, and also, the FWHM of the rocking curve is less than 5°. That is, when the thickness of the underlying metal layer 2 is approximately from 0.1 to 3.0 nm, the crystalline property and the crystalline orientation of the magnetoresistive layer 3 can be remarkably improved.

Similarly, the inventors obtained experimental results of the (111) peak intensity characteristics and the rocking curve characteristics of the 30 nm thick NiFe magnetoresistive layer 3 formed on the underlying metal layer 2 which are made of other metals such as Pt, Be, Cr, Fe, W and Y, as shown in FIG. 4 which is a table showing the thickness of the underlying metal layer 2 having less than a FWHM of the rocking curve of 5° for the metals Pt, Be, Cr, Fe, W and Y, respectively.

In FIG. 5, which is a table showing the melt-down current density characteristics of the magnetoresistive layer 3, if the magnetoresistive layer 3 of FIG. 1, which is of a rectangular shape of 2 μm×200 μm, was formed directly on the glass substrate 1 as in the prior art, the magnetoresistive layer 3 melted down when a current having a current density of about $1 \times 10^6$ A/cm$^2$ flowed therethrough. Also, in this case, hillocks were observed on the surface of the magnetoresistive layer 3 by a scanning electron microscope (SEM).

On the other hand, if the magnetoresistive layer 3 is formed via the underlying metal layer 2 made of 0.3 nm thick Al on the glass substrate 1 as in the embodiment, the magnetoresistive layer 3 was at melt down when a current having a current density of $7 \times 10^6$ A/cm$^2$ flowed therethrough. In this case, the underlying metal layer 2 and the magnetoresistive layer 3 are both of a rectangular shape of 2 μm×200 μm. In this case, note that, when a current having a current density of about $1 \times 10^6$ A/cm$^2$ flowed therethrough, hillocks were not observed on the surface of the magnetoresistive layer 3 by the SEM.

Thus, according to the embodiment of the present invention, the anti-electromigration characteristics can be remarkably improved.

Figure 6:
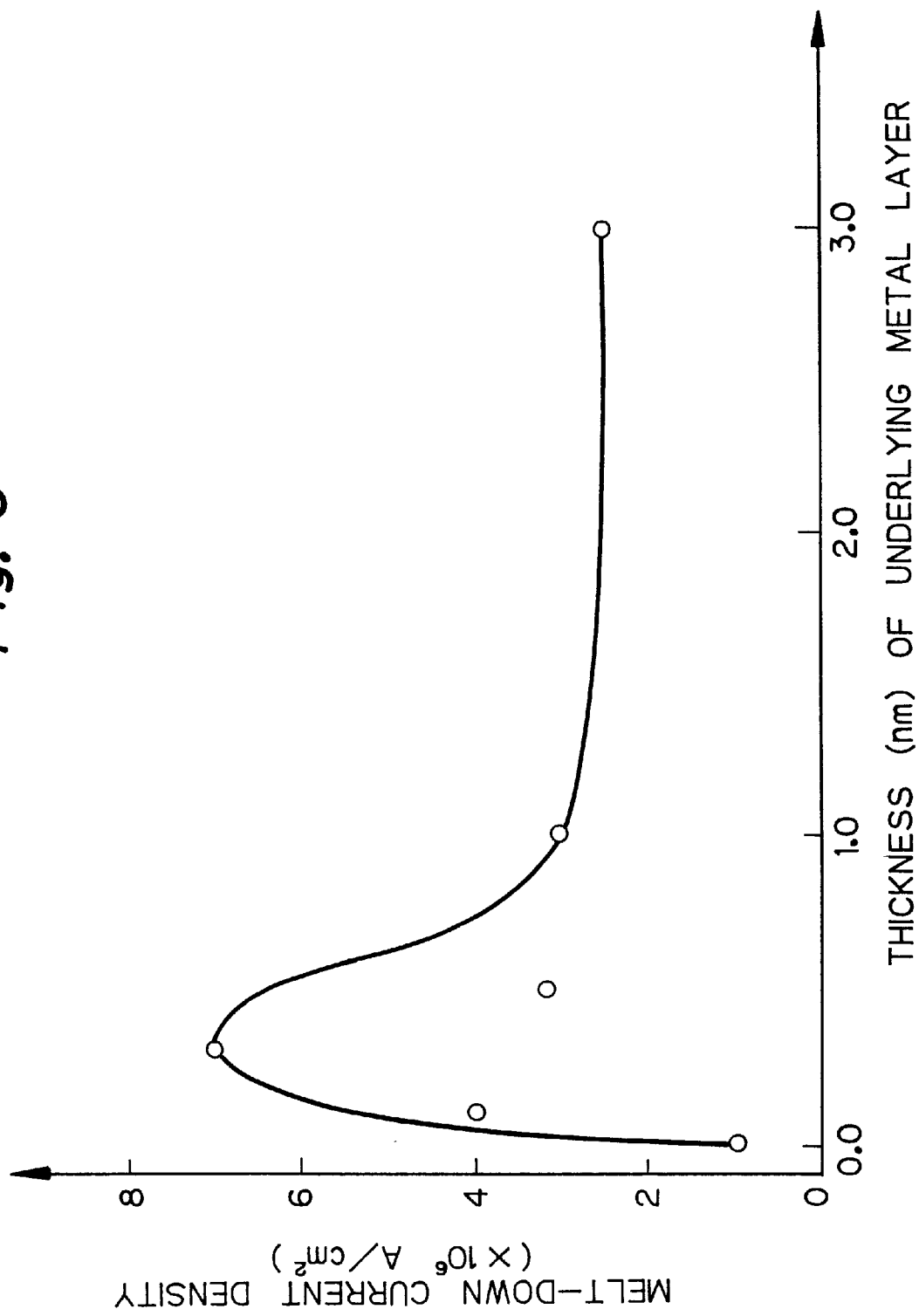
FIG. 6 is a graph showing the melt-down current density characteristics of the magnetoresitive layer in dependency of the thickness of the underlying metal layer of FIG. 1.

FIG. 6 shows the melt-down current density characteristics of the magnetoresistive layer 3 in dependency of the thickness of the underlying metal layer of FIG. 1. In FIG. 6, the underlying metal layer 2 and the magnetoresistive layer 3 are also of a rectangular shape of 2 μm×200 μm, and the underlying metal layer 2 is also made of Al. As shown in FIG. 6, when the thickness of the underlying metal layer 2 is approximately from 0.1 to 3.0 μm, the melt-down current density is large. That is, when the thickness of the underlying metal layer 2 is approximately from 0.1 to 3.0 μm, that anti-electromigration characteristics can be remarkably improved.

Similarly, the inventors found that the anti-electromigration characteristics of the magnetoresistive layer 3 can also be remarkably improved in the cases where the underlying metal layer 2 is made of Pt, Be, Cr, Fe, W or Y.

In the above-described embodiment, the underlying metal layer 2 and the magnetoresistive layer 3 can be formed by a conventional magnetron sputtering process.

Also, the magnetoresistive layer 3 can be made of Fe, Co, Ni or one of their alloys.

Further, the magnetoresistive layer 3 can be made of at least one period comprised of a ferromagnetic layer and a nonmagnetic layer. In this case, the ferromagnetic layer can be made of Fe, Co, Ni or one of their alloys, and the nonmagnetic layer can be made of Cu, Au, Ag or one of their alloys. Also, the ferromagnetic layer is about 1 to 30 nm thick, and the nonmagnetic layer is about 2 to 5 nm thick. Further, the number of periods is preferably about 2 to 50.

In addition, the magnetoresistive layer 3 can be made of at least one period comprised of an anti-ferromagnetic layer, a ferromagnetic layer, a nonmagnetic layer and a ferromagnetic layer. In this case, the ferromagnetic layer can be made of Fe, Co, Ni or one of their alloy; the nonmagnetic layer can be made of Cu, Au, Ag or one of their alloys; and the anti-ferromagnetic layer can be made of FeMn, NiMn, PtMn, PdMn, NiO, CoO, NiCoO, FeO or one of their alloys.

Further in the above-described multi-layer structure of anti-ferromagnetic layer/ferromagnetic layer/nonmagnetic layer/ferromagnetic layer, the anti-ferromagnetic layer can be made of NiO, CoO, NiCoO or NiO/CoO. In addition, an about 0.1 to 3 nm thick Fe layer can be inserted between the anti-ferromagnetic layer and the underlying metal layer 2, so that the Fe layer substantially serves as another underlying layer. Note that, if the anti-ferromagnetic layer is formed directly on the underlying metal layer 2, the improvement of the crystalline orientation characteristics cannot be expected. Also, in this case, the underlying metal layer 2 can be made of Hf, Zr or Ta, and is about 0.1 to 10 nm thick, so as to obtain an FWHM of the rocking curve of less than 5°.

The application of the magnetoresistive element of the present invention is explained next with reference to FIGS. 7, 8, 9A and 9B.

Figure 7:
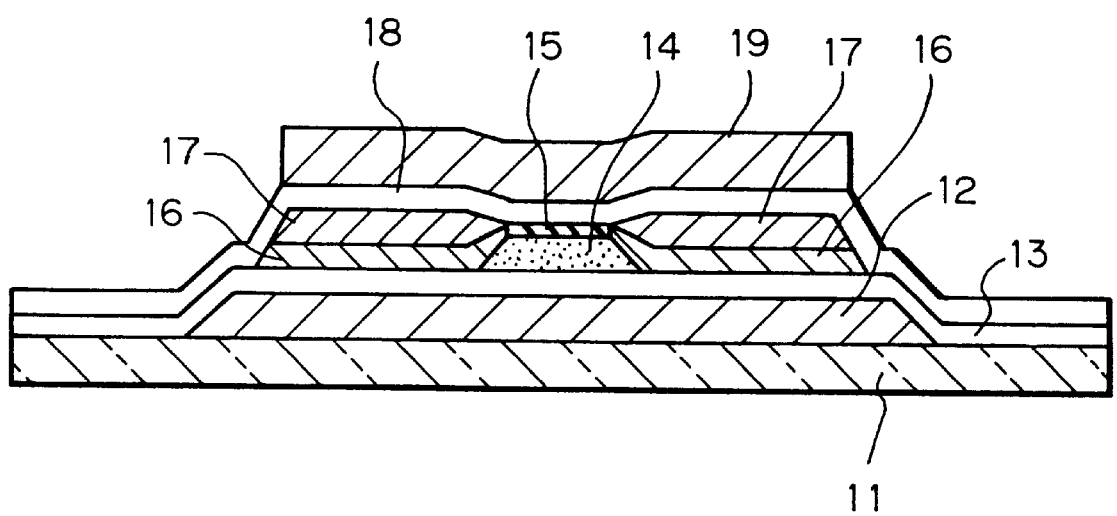
FIG. 7 is a cross-sectional view illustrating a shield-type MR head to which the embodiment of the present invention is applied.

In FIG. 7, which illustrates a shield-type MR sensor, reference numeral 11 designates a substrate on which a lower shield layer 12 and a lower gap layer 13 are formed. In this case, the substrate 11, the lower shield layer 12 and the lower gap layer 13 form the substrate 1 of FIG. 1. Also, a magnetoresistive element 14 formed by the underlying metal layer 2 and the magnetoresistive layer 3 of FIG. 1, and a gap defining insulating layer 15 are formed on the lower gap layer 13. The magnetoresistive element 14 is sandwiched by a longitudinal bias layer 16 and lower electrodes 17. Further, an upper gap layer 18 is formed on the entire surface, and an upper shield layer 19 is formed on the upper gap layer 18. Note that the gap defining insulating layer 15 may not be provided as occasion demands. Also, the lower gap layer 13 and the magnetoresistive element 14 are patterned by photolithography processes.

Figure 8:
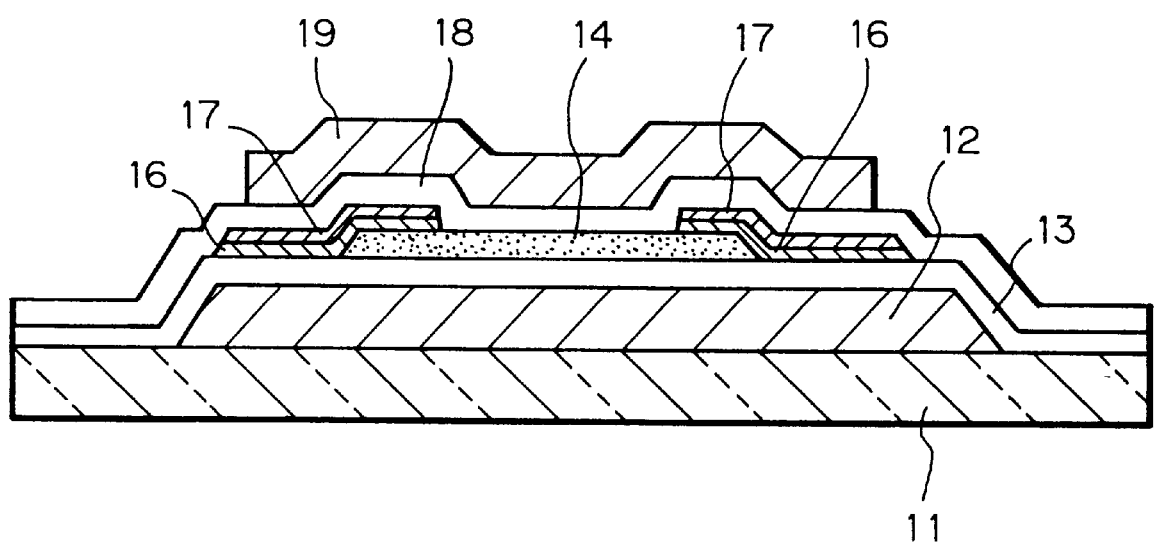
FIG. 8 is a cross-sectional view illustrating another shield-type MR head to which the embodiment of the present invention is applied.

In FIG. 8, which illustrates another shield-type MR sensor, the gap defining insulating layer 15 of FIG. 7 is not provided, and also, the longitudinal bias layer 16 and the lower electrode 17 partly cover the magnetoresistive element 14.

Figure 9A:
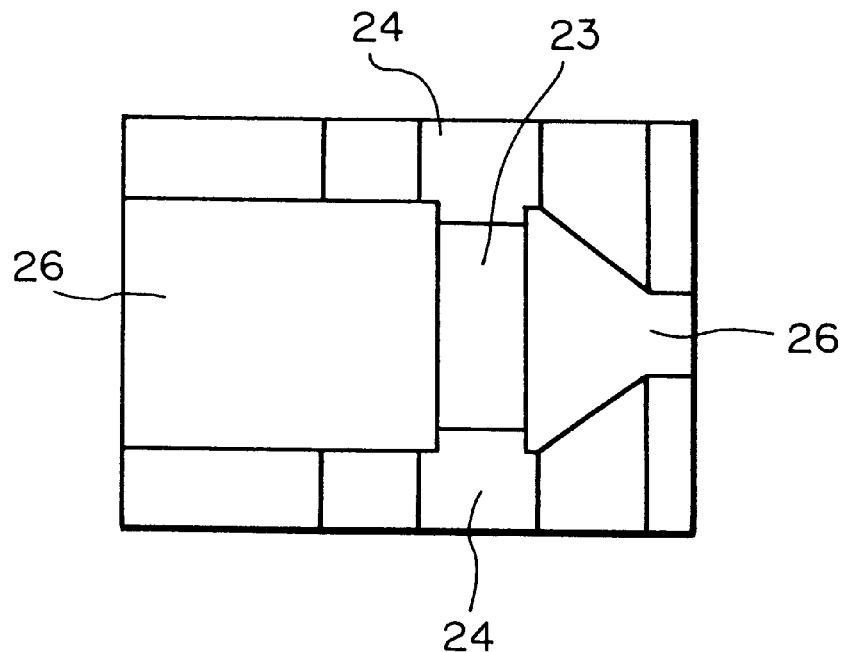
FIGS. 9A and 9B are a plan view and a cross-sectional view illustrating a yoke-type MR head to which the embodiment of the present invention is applied.
Figure 9B:
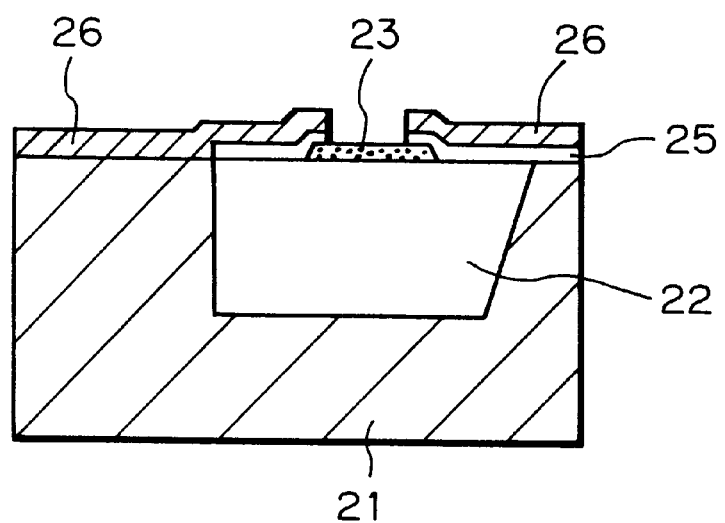

In FIGS. 9A and 9B, which are a plan view and a cross-sectional view illustrating a yoke-type MR sensor, reference numeral 21 designates a magnetic substrate having a nonmagnetic groove element 22. In this case, the magnetic substrate 21 and the nonmagnetic groove element 22 form the substrate 1 of FIG. 1. Also, a magnetoresistive element 23 formed by the underlying layer 2 and the magnetoresistive layer 3 of FIG. 1 is formed on the nonmagnetic groove element 22. Further, the magnetoresistive element 23 is sandwiched by electrodes 24. In addition, a gap layer 25 and a soft-magnetic yoke layer 26 are formed. Thus, a signal magnetic field from a medium is applied by the yoke layer 26 to the magnetoresistive layer 23.

In FIGS. 7, 8, 9A and 9B, the lower shield layer 12 and the yoke layer 26 can be made of NiFe, an alloy of CoZr, FeAlSi, FeSi or the like, and is about 0.5 to 10 μm thick. Also, the lower gap layer 13 can be made of $Al_2O_3$, $SiO_2$, AlN, SiN or the like, and is about 0.03 to 0.20 μm thick. The lower electrodes 17 can be made of Zr, Ta, Mo, one of their alloys, or one of their mixtures, and is about 0.01 to 0.10 μm thick. The longitudinal bias layer 16 can be made of CoCrPt, CoCr, CoPt, CoCrTa, FeMn, NiMn, NiO or NiCoO. The gap defining insulating layer 15 can be made of $Al_2O_3$, $SiO_2$, AlN or AlSi, and is about 0.005 to 0.05 μm thick. The upper gap layer 18 can be made of $Al_2O_3$, $SiO_2$, AlN or AlSi, and is about 0.03 to 0.20 μm thick.

As explained hereinabove, according to the present invention, since an about 0.1 to 3.0 nm thick underlying metal layer is provided between a substrate and a magnetoresistive layer, the crystalline property and crystalline orientation characteristics of the magnetoresistive layer can be remarkably improved. As a result, the change of resistance can be increased, and good heat-resistance characteristics and anti-electromigration characteristics can be obtained.

What is claimed is:

1. A magnetoresistive element comprising:

an non-magnetic substrate;

an underlying metal layer formed with direct contact on said substrate, said underlying metal layer having a thickness in a range of approximately 0.1 to 3.0 nm, and being made of one of Al, Pt, Be, Cr, W and Y; and a magnetoresistive layer formed directly on said underlying metal layer, said magnetoresistive layer having an improved crystalline orientation as compared to a magnetoresistive layer of the same material if formed without said underlying metal layer directly on said substrate.

2. The magnetoresistive element as set forth in claim 1, wherein said magnetoresistive layer comprises only a single magnetoresistive layer.

3. The magnetoresistive element as set forth in claim 2, wherein said single magnetoresistive layer is made of NiFe and is about 30 nm thick.

4. The magnetoresistive element as set forth in claim 1, wherein said magnetoresistive layer comprises at least one period comprised of a ferromagnetic layer and a nonmagnetic layer.

5. The magnetoresistive element as set forth in claim 4, wherein said ferromagnetic layer is made of one of Fe, Co, Ni and their alloys.

6. The magnetoresistive element as set forth in claim 4, wherein said ferromagnetic layer is about 1 to 30 nm thick.

7. The magnetoresistive element as set forth in claim 4, wherein said nonmagnetic layer is made of one of Cu, Au, Ag and their alloys.

8. The magnetoresistive element as set forth in claim 1, wherein said magnetoresistive layer comprises at least one period comprised of an anti-ferromagnetic layer, a first ferromagnetic layer, a nonmagnetic layer and a second ferromagnetic layer.

9. The magnetoresistive element as set forth in claim 8, wherein each of said first and second ferromagnetic layers is made of one of Fe, Co, Ni and their alloys.

10. The magnetoresistive element as set forth in claim 8, wherein each of said first and second ferromagnetic layers is about 1 to 30 nm thick.

11. The magnetoresistive element as set forth in claim 8, wherein said nonmagnetic layer is made of one of Cu, Au, Ag and their alloys.

12. The magnetoresistive element as set forth in claim 8, wherein said anti-ferromagnetic layer is made of one of FeMn, NiMn, PtMn, PdMn, NiO, CoO, NiCoO, FeO and their alloys.

13. The magnetoresistive element as set forth in claim 1, wherein said magnetoresistive layer has an FWHM of a rocking curve of less than 5° by an X-ray diffraction measurement.

* * * * *